United States Patent

Hung et al.

(10) Patent No.: US 6,760,231 B2
(45) Date of Patent: Jul. 6, 2004

(54) FASTENING ASSEMBLY FOR ATTACHING STRUCTURES

(75) Inventors: Weicheng Hung, Tao-Yuan (TW);
Sheng-Ming Lou, Taipei County (TW);
James Wu, Yi-Lan County (TW);
Yente Chiang, Taipei (TW)

(73) Assignee: High Tech Computer, Corp., Tao Yuan (TW)

( * ) Notice: Subject to any disclaimer, the term of this patent is extended or adjusted under 35 U.S.C. 154(b) by 0 days.

(21) Appl. No.: 10/249,287

(22) Filed: Mar. 28, 2003

(65) Prior Publication Data

US 2003/0214791 A1 Nov. 20, 2003

(30) Foreign Application Priority Data

May 15, 2002 (TW) ........................................ 91206921 U

(51) Int. Cl.[7] ............................ H05K 5/00; H05K 5/04; H05K 5/06

(52) U.S. Cl. ................... 361/758; 361/759; 361/801; 361/803; 361/804; 361/740; 361/742; 174/138 G

(58) Field of Search ............................ 361/758, 759, 361/756, 801, 802, 803, 790, 804, 740, 741, 752, 742; 174/138 G, 138 R

(56) References Cited

U.S. PATENT DOCUMENTS

| | | | | |
|---|---|---|---|---|
| 4,877,275 A | * | 10/1989 | DeForrest, Sr. | 292/148 |
| 5,499,163 A | * | 3/1996 | Sonntag et al. | 361/759 |
| 5,746,609 A | * | 5/1998 | Franks, Jr. | 439/92 |
| 6,050,114 A | * | 4/2000 | Park | 70/2 |
| 6,147,305 A | * | 11/2000 | Honma et al. | 174/52.1 |

* cited by examiner

*Primary Examiner*—David A. Zarneke
*Assistant Examiner*—Thanh Y. Tran
(74) *Attorney, Agent, or Firm*—Jiang Chyun IP Office

(57) ABSTRACT

A fastening assembly, used for fixedly fastening a first and a second structure (1100, 1200) of a device together, comprises an anchoring block (1500), an insert plate (1400), and a screw (1300). The first structure is provided with a hole (1110). The anchoring block, fixedly arranged on the second structure, includes two parallel holding flanges (1510, 1512) and two parallel protruding ribs (1520), wherein the holding flange (1510) further includes a slot (15101). The protruding ribs extend approximately perpendicular to the two holding flanges on two sides thereof. The insert plate is held between the holding flanges, and is provided with a threaded hole (1410) and a pair of hooked clamping members (1420) that respectively tightly clamp the protruding ribs. The screw extends through the hole of the first structure and engages in the threaded hole of the insert plate to fixedly fasten the first and second structures of the device together.

14 Claims, 3 Drawing Sheets

FASTENING ASSEMBLY FOR ATTACHING STRUCTURES

CROSS REFERENCE TO RELATED APPLICATIONS

This application claims the priority benefit of Taiwan application serial no. 91 206921, filed May 15, 2002.

BACKGROUND OF INVENTION

1. Field of the Invention

The invention relates generally to fastening assemblies and, more particularly, to a fastening assembly that can be arranged within a space having a reduced profile to fixedly fasten two structures together.

2. Description of the Related Art

As the requirement for information access and processing is increased, information appliances particularly become more popular. "Information appliances" broadly embrace electronic devices that are provided with the functions of telecommunication and/or internet access.

A typical type of information appliance is the personal digital assistant (PDA). A PDA usually includes the functions of scheduler, event recording, telecommunication, electronic phonebook, etc.

As shown in FIG. 1, to fixedly fasten two plastics structures 100, 200 of the PDA, i.e., top and bottom covers of the PDA together, a traditional fastening assembly uses a threaded insert nut 400 that is securely accommodated within a boss 210, provided on one plastics structure 200, via ultrasonic welding. The insert nut 400 is externally formed with grooves to enhance its fastening effect to the boss 210. The two plastics structures 100, 200 are fixedly attached to each other by a screw 300 extending through a hole 110 of the plastics structure 100 and threadedly engaging in the insert nut 400.

With the above traditional fastening assembly, the fastening of the insert nut 400 within the boss 210 can be effectively achieved only at the condition that a required minimum height of the boss 210 is satisfied. If the height is insufficient, the insert nut 400 can not be fixedly attached within the boss 210, which results in that the screw 300 and the insert nut 400 cannot have a secure engagement therebetween and the plastics structures 100, 200 can not be fastened securely together.

Since the size of the PDA is increasingly reduced as miniaturization techniques are developed, lower profile is available for the disposition of the fastening assembly. The traditional fastening assembly as described above therefore becomes an obstacle to further size reduction.

SUMMARY OF INVENTION

An aspect of the invention is therefore to provide a fastening assembly that can fasten two structures (for example, top and bottom covers) of an electronic device (for example, a PDA) together without the need of a boss element so that the mount height needed by the fastening assembly is reduced, thereby enabling the electronic device to have a compact design.

To accomplish the above and other objectives, the invention provides a fastening assembly that is used for fixedly fastening a first and a second structure of an electronic device together. The electronic device has a low profile. The first structure is provided with a hole. The fastening assembly comprises an anchoring block, an insert plate, and a screw. The anchoring block, fixedly arranged on the second structure, includes upper and lower parallel, horizontally-extending holding flanges and two parallel, vertically-extending protruding ribs. The upper holding flange further includes a slot. The protruding ribs extend approximately perpendicular to the holding flanges on two sides thereof. The insert plate, formed from an approximately flat plate, is fixedly held between the holding flanges and is further provided with a threaded hole and a pair of hooked clamping members. The threaded hole is placed correspondingly to the slot of the upper holding flange, and each hooked clamping member tightly clamps one protruding rib to fasten the insert plate with the anchoring block. The screw extends through the hole of the first structure and the slot of the upper holding flange to threadedly engage in the threaded hole of the insert plate to thereby securely fasten the first and second structures together.

In accordance with the above and other objectives, the attachment of the insert plate to the anchoring block is further secured according to various manners such as ultrasonic welding, adhesion or insert molding.

The above fastening assembly is dimensionally adaptable in accordance with the mount height available within the device meanwhile ensuring an effective fastening of the two structures.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate an embodiment of the invention and, together with the description, serve to explain the principles of the invention. In the drawings.

DETAILED DESCRIPTION

Figure 1:
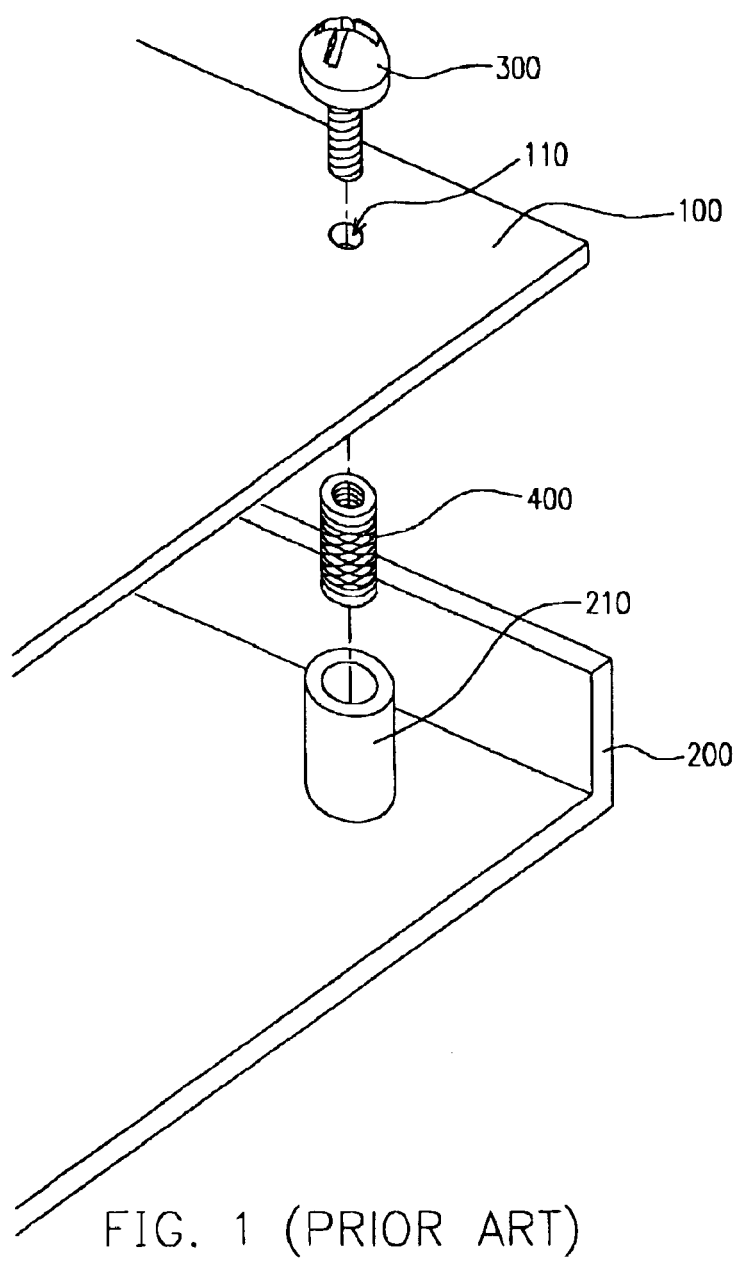
FIG. 1 is a perspective view schematically illustrating a traditional fastening assembly of two plastics structures.

The following detailed description of the embodiment and example of the present invention with reference to the accompanying drawings is only illustrative and not limiting. Wherever possible in the following description and accompanying drawings, like reference numerals and symbols will refer to like elements and parts unless otherwise described.

Figure 2:
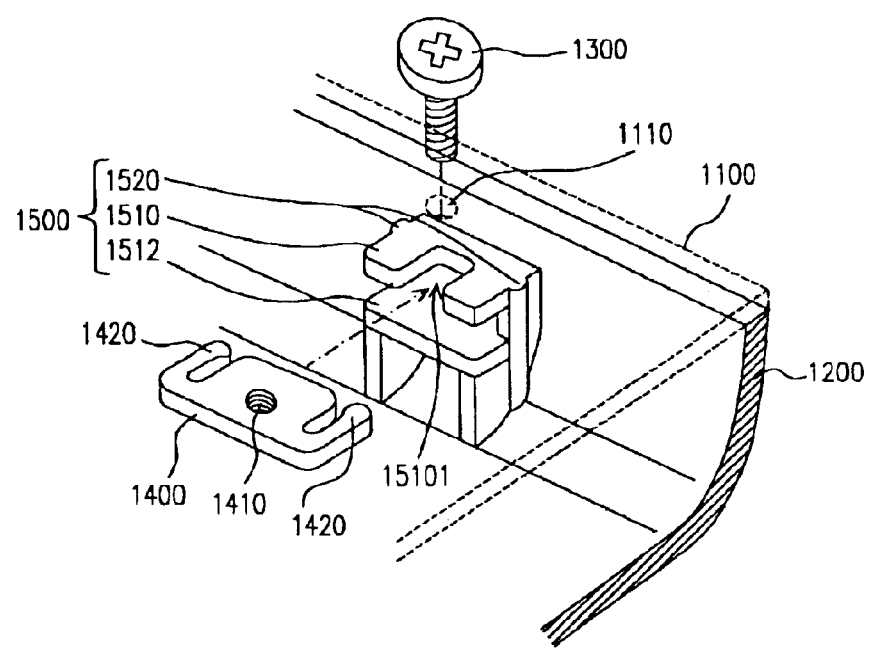
FIG. 2 is a perspective view schematically illustrating a fastening assembly of two plastics structures according to an embodiment of the invention.

Referring to FIG. 2, a perspective view schematically illustrates a fastening assembly according to an embodiment of the invention. As illustrated, a fastening assembly of the invention is directed to fixedly fasten two structures 1100, 1200 that are, for example, plastics top and bottom covers of an electronic device such as a PDA together. The fastening assembly comprises an anchoring block 1500, an insert plate 1400 made of, for example, a metal-based material, and a screw 1300.

The anchoring block 1500 comprises upper and lower holding flanges 1510, 1512 approximately parallel to each other and extending horizontally, and two protruding ribs 1520. The upper holding flange 1510, approximately U-shaped, centrally defines a slot 15101. The ribs 1520, approximately semi-cylindrical and parallel to each other, are approximately perpendicular to the holding flanges 1510, 1512 and further symmetrically extend on two sides of the holding flanges 1510, 1512. The anchoring block 1500 may be formed, for example, in a single body integral with the plastics structure 1200.

Figure 3:
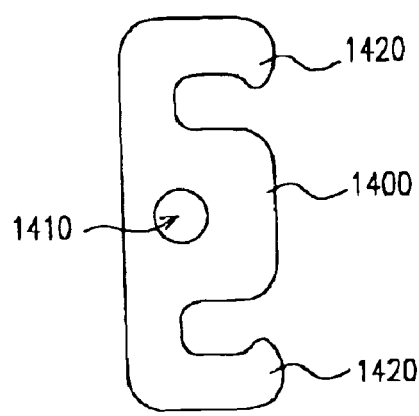
FIG. 3 is a planar top view of an insert plate of the fastening assembly according to the embodiment of the invention.

Referring to FIG. 3, a top planar view schematically illustrates the insert plate 1400 of the fastening assembly. As illustrated, the insert plate 1400 is an approximately flat plate within a central region of which is formed a threaded hole 1410. Two sides of the insert plate 1400 further extend symmetrically in bent shapes to respectively form hooked clamping members 1420.

Figure 4:
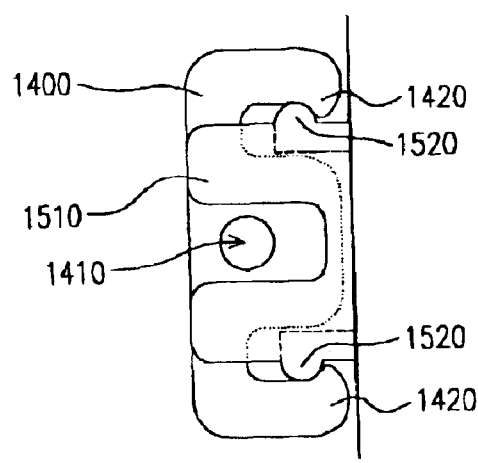
FIG. 4 is a planar view schematically illustrating the mount of the insert plate to an anchoring block within the fastening assembly according to the embodiment of the invention.

When the insert plate 1400 is fixedly held between the holding flanges 1510, 1512, the location of the threaded hole 1410 of the insert plate 1400 corresponds to the slot 15101 of the upper holding flange 1510 and a through hole 1110 of the plastics structure 1100. Each hooked clamping member 1420 tightly clamps a protruding rib 1520 to ensure proper positioning and tight fastening of the insert plate 1400 with the anchoring block 1500, as shown in FIG. 4.

The screw 1300 is brought to extend through the through hole 1110 of the plastics structure 1100 and the slot 15101 of the upper holding flange 1510, and threadedly engage in the threaded hole 1410 of the insert plate 1400 to thereby fixedly fasten the structures 1100, 1200 together. According to the design requirements, it would be readily appreciated that the above-described fastening assembly may be replicated at a plurality of locations to provide adequate fastening of the plastics structures 1100, 1200.

Besides clamping between the hooked clamping members 1420 and the ribs 1520, the attachment of the insert plate 1400 to the anchoring block 1500 may be further secured according to various manners known in the art such as ultrasonic welding, adhesion, or insert molding.

As described above, the fastening assembly of the invention therefore includes at least the following advantages.

The sizes and the shapes of the anchoring block and the insert plate of the invention can be adaptable to accommodate the mount height available to achieve fastening of the structures of the device. As a result, the traditional incompatibility between a reduced profile of the device and a required minimum height of the embedded boss to ensure proper fastening is therefore overcome with the fastening assembly of the invention.

Furthermore, the attachment of the insert plate to the anchoring block can be further secured according to different manners such as clamping, thermal or ultrasonic welding, adhesion, or insert molding, etc., which therefore provides more flexibility.

Moreover, it will be understood that the specific constructions of the anchoring block and insert plate are not limited to the description herein and may be variously modified without departing from the inventive concepts of the invention as embodied above. Therefore, the above description of embodiment and example only illustrates a specific way of making and performing the invention that, consequently, should cover variations and modifications thereof, provided they fall within the inventive concepts as defined in the following claims.

What is claimed is:

1. A fastening assembly, adapted to fixedly fasten with each other a first and a second structure of a device, wherein the first structure is provided with at least a hole, the fastening assembly comprising:

an anchoring block, fixedly provided on the second structure, and including upper and lower holding flanges and two protruding ribs, wherein the upper and lower holding flanges are parallel to each other and define an insertion space therebetween, the upper holding flange including a slot, and the two protruding ribs are approximately parallel to each other and further extend approximately perpendicular to the upper and lower holding flanges on two respective sides thereof;

an insert plate, shaped in an approximately flat plate and fixedly held in the insertion space between the upper and lower holding flanges, the insert plate being provided with a threaded hole and a pair of hooked clamping members, the threaded hole corresponding to the slot of the upper holding flange and the at least a hole of the first structure, and each hooked clamping member tightly clamping one protruding rib to fasten the insert plate with the anchoring block; and a screw, extending through the at least a hole of the first structure and the slot of the upper holding flange to threadedly engage in the threaded hole of the second structure to fixedly fasten the first and second structures together.

2. The fastening assembly of claim 1, wherein the anchoring block is integrally formed with the second structure in a single body, the second structure being made of plastics material.

3. The fastening assembly of claim 1, wherein the insert plate includes a metal-based material.

4. The fastening assembly of claim 1, wherein fastening of the anchoring block with the insert plate is further by adhesion.

5. The fastening assembly of claim 1, wherein fastening of the anchoring block with the insert plate is further secured by ultrasonic welding.

6. A fastening assembly, adapted to fixedly fasten with each other a first and a second structure of an electronic device, wherein the first structure is provided with a hole, and the second structure is provided with an anchoring block that defines an insertion space therein, the fastening assembly comprising:

an insert plate, shaped in an approximately flat plate and fixedly held in the insertion space of the anchoring block, the insert plate being provided with a threaded hole and a pair of hooked clamping members, the threaded hole corresponding to the hole of the first structure, and the hooked clamping members tightly clamping the anchoring block to fixedly fasten the insert plate with the anchoring block; and a screw extending through the hole of the first structure to threadedly engage in the threaded hole of the insert plate to fixedly fasten the first and second structures together.

7. The fastening assembly of claim 6, wherein the anchoring block is integraly formed with the second structure in a single body.

8. The fastening assembly structure of claim 6, wherein the insert plate is made of metal.

9. The fastening assembly of claim 6, wherein fastening of the anchoring block with the insert plate is further secured by adhesion.

10. The fastening assembly of claim 6, wherein fastening of the anchoring block with the insert plate is further secured by ultrasonic welding.

11. The fastening assembly of claim 6, wherein fastening of the anchoring block with the insert plate is further secured by insert molding.

12. An electronic device, comprising:

a first cover defining a hole therethrough;

a second cover forming thereon an anchoring block;

an insert plate inserted into the anchoring block, defining a threaded hole therein, wherein the anchoring block comprises upper and lower holding flanges, and the insert plate is located between the upper and lower flanges; and a screw extending through the hole of the first cover and the upper holding flange of the anchoring block to threadedly engage in the threaded hole of the insert plate to thereby fixedly fasten the first and second covers together;

wherein the insert plate forms two hooked clamping members and the anchoring block forms two ribs, the hooked clamping members respectively engaging with the ribs to thereby secure the insert plate to the anchoring block.

13. The electronic device of claim 12, wherein the ribs are vertically extended on two sides of the anchoring block, respectively.

14. The electronic device of claim 13, wherein the upper flange defines a slot therein, and the screw extends through the slot of the upper flange to engage in the threaded hole of the insert plate.

* * * * *